United States Patent
Deshmukh et al.

(10) Patent No.: US 9,576,810 B2
(45) Date of Patent: Feb. 21, 2017

(54) PROCESS FOR ETCHING METAL USING A COMBINATION OF PLASMA AND SOLID STATE SOURCES

(71) Applicant: Applied Materials, Inc., Santa Clara, CA (US)

(72) Inventors: Subhash Deshmukh, Livermore, CA (US); Joseph Johnson, Redwood City, CA (US); Jingjing Liu, Sunnyvale, CA (US); He Ren, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/290,861

(22) Filed: May 29, 2014

(65) Prior Publication Data
US 2015/0099369 A1   Apr. 9, 2015

Related U.S. Application Data

(60) Provisional application No. 61/887,830, filed on Oct. 7, 2013, provisional application No. 61/886,521, filed on Oct. 3, 2013.

(51) Int. Cl.
| | |
|---|---|
| *H01L 21/3065* | (2006.01) |
| *H01J 37/32* | (2006.01) |
| *C23F 4/00* | (2006.01) |
| *H01L 21/311* | (2006.01) |
| *H01L 21/3213* | (2006.01) |

(Continued)

(52) U.S. Cl.
CPC ............ *H01L 21/3065* (2013.01); *C23F 4/00* (2013.01); *H01J 37/321* (2013.01); *H01J 37/32146* (2013.01); *H01J 37/32862* (2013.01); *H01L 21/02071* (2013.01); *H01L 21/268* (2013.01); *H01L 21/2686* (2013.01); *H01L 21/31116* (2013.01); *H01L 21/32135* (2013.01);

(Continued)

(58) Field of Classification Search
None
See application file for complete search history.

(56) References Cited

U.S. PATENT DOCUMENTS

| | | |
|---|---|---|
| 4,490,211 A | 12/1984 | Chen et al. |
| 5,005,519 A | 4/1991 | Egermeier et al. |

(Continued)

FOREIGN PATENT DOCUMENTS

| | | |
|---|---|---|
| CN | 105659364 | 6/2016 |
| JP | 2002329961 A | 11/2002 |

(Continued)

OTHER PUBLICATIONS

K. Choi and C. Han, "Low Temperature Copper Etching Using an Inductively Coupled Plasma with Ultraviolet Light Irradiation", J. Electrochem. Soc. vol. 145, Year 1998, pp. L37-L39.*

(Continued)

*Primary Examiner* — Jiong-Ping Lu
(74) *Attorney, Agent, or Firm* — Kilpatrick Townsend & Stockton LLP

(57) ABSTRACT

An apparatus configured to remove metal etch byproducts from the surface of substrates and from the interior of a substrate processing chamber. A plasma is used in combination with a solid state light source, such as an LED, to desorb metal etch byproducts. The desorbed byproducts may then be removed from the chamber.

19 Claims, 5 Drawing Sheets

(51) Int. Cl.
  *H05K 3/02* (2006.01)
  *H01L 21/268* (2006.01)
  *H01L 21/02* (2006.01)

(52) U.S. Cl.
  CPC ....... *H01L 21/32136* (2013.01); *H05K 3/027* (2013.01); *H01J 2237/3343* (2013.01)

(56) References Cited

U.S. PATENT DOCUMENTS

| | | | |
|---|---|---|---|
| 5,487,127 | A | 1/1996 | Gronet et al. |
| 6,407,001 | B1 | 6/2002 | Scott |
| 6,569,775 | B1 * | 5/2003 | Loewenhardt .... H01L 21/32136 156/345.24 |
| 6,734,102 | B2 | 5/2004 | Rathi et al. |
| 6,933,182 | B1 | 8/2005 | Ohnuma et al. |
| 7,501,355 | B2 * | 3/2009 | Bhatia et al. ................ 438/791 |
| 7,732,793 | B2 | 6/2010 | Ershov et al. |
| 7,947,584 | B2 * | 5/2011 | Moffatt ........................ 438/535 |
| 2003/0082412 | A1 | 5/2003 | Fukuda et al. |
| 2003/0228415 | A1 | 12/2003 | Bi et al. |
| 2008/0063809 | A1 | 3/2008 | Lee et al. |
| 2008/0073222 | A1 | 3/2008 | Yamauchi et al. |
| 2010/0190098 | A1 | 7/2010 | Walker et al. |
| 2010/0267174 | A1 | 10/2010 | Moffatt |
| 2011/0146909 | A1 | 6/2011 | Shih et al. |
| 2013/0267096 | A1 | 10/2013 | Hawryluk et al. |
| 2014/0263180 | A1 | 9/2014 | Moffatt et al. |
| 2014/0273504 | A1 | 9/2014 | Nainani et al. |
| 2015/0096683 | A1 | 4/2015 | Deshmukh et al. |
| 2015/0235847 | A1 | 8/2015 | Beasley et al. |
| 2015/0380265 | A1 | 12/2015 | Yim et al. |

FOREIGN PATENT DOCUMENTS

| | | |
|---|---|---|
| KR | 10-0275534 B1 | 12/2000 |
| KR | 2001-0058535 A | 7/2001 |
| KR | 2005-0059451 A | 6/2005 |
| TW | 201519312 A | 5/2015 |
| WO | 2015050715 A1 | 4/2015 |
| WO | 2015050716 A1 | 4/2015 |

OTHER PUBLICATIONS

International Search Report and Written Opinion dated Dec. 30, 2014 for International Application No. PCT/US2014/056393, 27 pages.
Hahn et al., "Dry etching mechanism of copper and magnetic materials with UV illumination", *Materials Science and Engineering* B79 (2001) 20-26.
PCT/US2014/056352, "International Preliminary Report on Patentability", Apr. 14, 2016, 8 pages.
PCT/US2014/056393, "International Preliminary Report on Patentability", Apr. 14, 2016, 8 pages.
U.S. Appl. No. 14/290,856, "Final Office Action", Mar. 15, 2016, 24 pages.
U.S. Appl. No. 14/290,856, "Non-Final Office Action", Nov. 25, 2015, 21 pages.
PCT/US2014/056352, "International Search Report and Written Opinion", Dec. 30, 2014, 16 pages.

* cited by examiner

PROCESS FOR ETCHING METAL USING A COMBINATION OF PLASMA AND SOLID STATE SOURCES

CROSS-REFERENCES TO RELATED APPLICATIONS

This application claims priority to Provisional Application No. 61/887,830, filed Oct. 7, 2013, titled "APPARATUS FOR ETCHING SUBSTRATES PRODUCING NON-VOLATILE BYPRODUCTS USING COMBINATION OF PLASMA AND LED SOURCES" and Provisional Application No. 61/886,521, filed Oct. 3, 2013, titled "LED BASED OPTICAL SOURCE COUPLED WITH PLASMA SOURCE", which are hereby incorporated by reference in their entirety.

BACKGROUND OF THE INVENTION

The use of metals such as copper and cobalt as a conductive interconnect material is favored in semiconductor devices because of the high electrical conductivities and circuit speeds these metals enable. On the other hand, such metals are difficult to pattern. As such, copper interconnect leads have predominantly heretofore been formed using damascene and dual damascene processing technology whereby openings are formed in a dielectric layer on a substrate such as a semiconductor substrate used to form semiconductor devices. Copper is deposited over the dielectric layer and within the openings. Polishing/planarization removes copper from over the dielectric leaving the copper inlaid within the openings. In this way, the burden on photolithography is shifted from copper to the more manageable dielectric layer. The inlaid copper includes an upper surface that is essentially co-planar with the top surface of the patterned dielectric layer in which the copper is formed.

Subtractive metal etching is an alternative to a damascene process flow. A contiguous layer of metal is deposited and then patterned to form horizontal electrical interconnections. One process employed to perform subtractive metal etching uses a plasma. The plasma selectively removes the metal, however it may redeposit metal-containing residues on the substrate as well as within the processing chamber. Such residues can be difficult to remove and may have deleterious effects on the semiconductor device as well as the chamber.

BRIEF SUMMARY OF THE INVENTION

Methods of removing etch residue from a substrate as well as from the interior surfaces of an etch process chamber are described. A plasma treatment transforms a metal on the substrate into metal byproducts that deposit on the wafer as well as the interior surfaces of the etch process chamber. Light emitting diodes are used to desorb the metal byproducts at a relatively low temperature so they can be removed from the substrate and the etch process chamber.

To better understand the nature and advantages of the present invention, reference should be made to the following description and the accompanying figures. It is to be understood, however, that each of the figures is provided for the purpose of illustration only and is not intended as a definition of the limits of the scope of the present invention.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Certain embodiments of the present invention relate to a method that is useful for the fabrication of semiconductor devices. While the present invention can be useful to produce a wide variety of semiconductor devices, some embodiments of the invention are particularly useful for producing semiconductor devices having metallic layers subtractively patterned with a plasma process, as described in more detail below. It is understood, however, that such a process may also be employed to subtractively pattern non-metallic layers and remove subsequent residues.

Methods of removing copper byproducts from the surface of a substrate and from the interior surfaces of an etch process chamber are described. A substrate having a copper layer is placed in the chamber. A plasma treatment transforms the copper into copper containing byproducts that deposit on the substrate and the interior surfaces of the chamber. UV energy is used to desorb the copper containing byproducts so they can be exhausted from the chamber.

Figure 1:
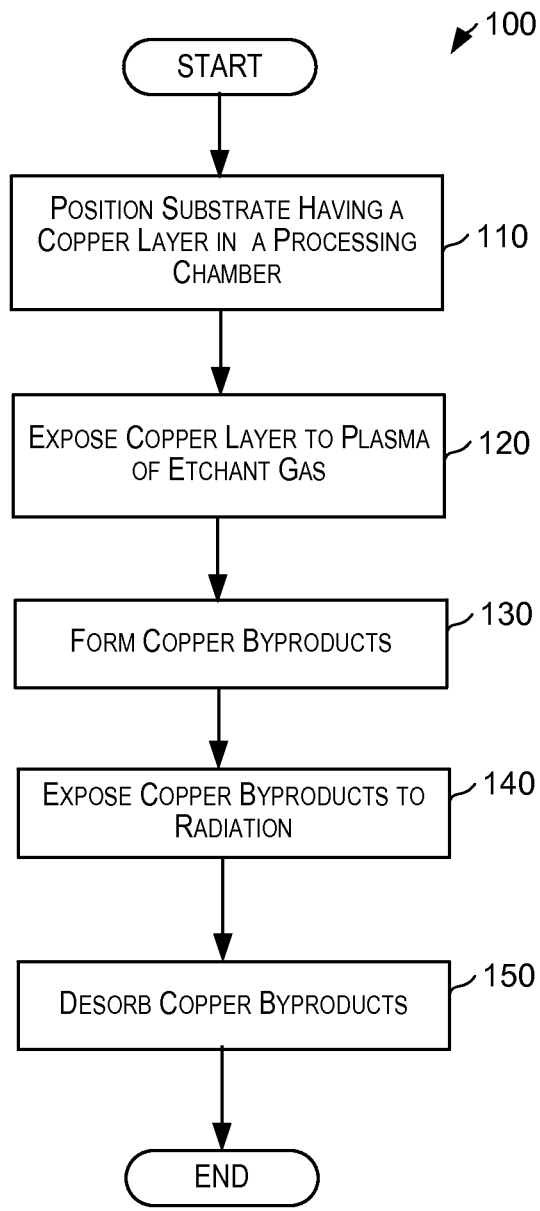
FIG. 1 is an example method for removing a metal from a substrate according to some embodiments.

In order to better understand and appreciate the invention, reference is now made to FIG. 1 which is a flow chart of an example copper etch and copper byproduct removal process 100 according to embodiments. In operation 110 a substrate having a layer of copper is positioned in a processing chamber. Operations 120-150 can be performed simultaneously or sequentially. In operation 120 the copper layer is exposed to a radical etchant gas. While myriad etchant gasses may be used, in some embodiments the etchant gas may comprise chlorine, hydrogen, oxygen, or a more complex gas such as $C_2H_5OH$ and $CF_3C(O)CH_2C(O)CF_3$ known as hexafluroacetylacetone (hfac). In some embodiments the gasses are used individually, while in other embodiments they may be used in combination and/or in series with one another. In one embodiment a chlorine containing gas is used. In another embodiment a gas comprising hydrogen may be used. In another embodiment an oxygen containing gas may be used. In a further embodiment an HCl and a $C_2H_2$ gas are simultaneously used. In still further embodiments a gas comprising $H_2O_2$ is used. In another embodiment a chlorine containing gas is followed by a subsequent hydrogen containing gas. In yet another embodiment both a chlorine containing gas and a hydrogen containing gas are used simultaneously. In a further embodiment an oxygen containing gas is used, followed by a hydrogen and oxygen containing gas. In some embodiments gasses comprising HCl and $C_2H_2$ may be used. In one embodiment a gas comprising H2O2 may be used followed by an hfac gas. In other embodiments, the etchant gas may comprise a halide, an oxidizer and/or a hydride. In some embodiments, the exposure to the etchant gas may be performed below 250 degrees C. In other embodiments the exposure may be performed at a temperature below 150 degrees C.

In operation 130, copper byproducts may be formed as a result of the exposure in operation 120. The composition of the copper byproducts varies, depending upon which gas the copper layer was exposed to. In some embodiments the copper byproducts may comprise copper and chlorine. In other embodiments, the copper byproducts may comprise copper and hydrogen. In further embodiments the copper byproducts may comprise copper and oxygen, and/or copper and hfac. The copper byproducts deposit on the interior surfaces of the chamber and on the substrate.

In operation 140, the copper byproducts are exposed to radiation. In some embodiments the radiation is emitted from a solid state source having a wavelength between 10-2000 nm. In other embodiments the wavelength may be between 60-500 nm. In one embodiment the solid state source is an LED while in another embodiment it is a laser diode. Other solid state or light sources may be used without departing from the invention.

In operation 150 at least some of the copper byproducts are desorbed due to the exposure to the radiation. More specifically, at least some of the copper byproducts are converted to more volatile species that can be gasified and subsequently removed from the etch chamber.

In some embodiments the exposure of the one or more copper byproducts to radiation may occur while the substrate is exposed to the plasma effluents of one or more of the etchant gases. In other embodiments the exposure of the one or more copper byproducts to radiation occurs after the substrate is exposed to the plasma effluents of one or more of the etchant gases. In further embodiments, the exposure to the plasma effluents and the exposure to radiation are continuously pulsed.

Figure 2:
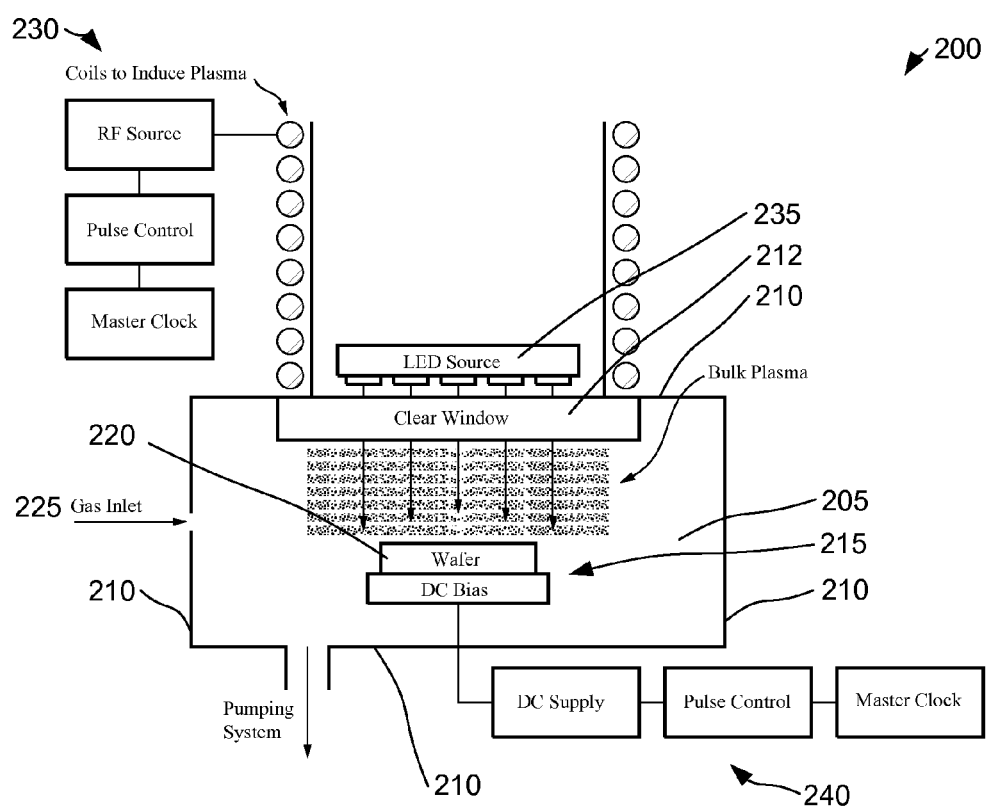
FIG. 2 is an example substrate processing system according to some embodiments.

FIG. 2 illustrates an example of a substrate processing system 200 that may be employed in an embodiment. Substrate processing system 200 has a substrate processing region 205 surrounded by one or more chamber walls 210. In one embodiment, at least one of chamber 210 walls is a window 212. A substrate support 215 is disposed within the substrate processing chamber and is configured to support a substrate 220 in substrate processing region 205 during a substrate processing operation. A gas delivery system 225 may be used to deliver one or more process gasses to substrate processing region 205. An inductively coupled plasma source 230 forms a plasma within the substrate processing chamber. In some embodiments the plasma source is a remote plasma source while in other embodiments it is an in-situ plasma source. In further embodiments the plasma source may be toroidal. A plurality of LEDs 235 are positioned outside the substrate processing chamber and configured to emit radiation into the substrate processing chamber through window 212. Substrate support 215 may be positioned directly opposite from and closely spaced to LEDs 235. A controller is coupled to the plasma source and plurality of LEDs 235. The controller is configured to sequentially pulse the plasma source and plurality of LEDs 235.

In some embodiments a biasing system 240 is configured to apply a bias between substrate 220 and an electrode. In further embodiments a DC or RF bias is used. In some embodiments the controller may sequentially pulse the plasma source, the LEDs and biasing system 240. Myriad pulsing sequences may be used including, but not limited to, the examples below. It is understood that not only the sequence of the pulses may be varied, but also the pulse duration, power and frequency. FIG. 2 illustrates example pulsing sequences. In one embodiment, by pulsing the three sources, seven different process conditions may be created:
  1. Pulse Plasma
  2. Pulse DC Biasing
  3. Pulse LED Energy
  4. Plasma+DC Biasing (RIE)
  5. DC Biasing+LED Energy
  6. Plasma+LED Energy (Conditioning Plasma/Altering Process Gasses)
  7. Plasma+DC Biasing+LED Energy (LED Assisted Reactive Ion Etching (RIE))

These seven process conditions provide a novel solution to processing nonvolatile residues. The pulses may be changed in duration, amplitude, and/or order to achieve different lengths and magnitudes of each of the process conditions listed above. Each source may be pulsed or may operate continuously. Gases may also be introduced and may be pre-processed by UV light from the LEDs.

The plurality of LEDs may be of myriad configurations. In some embodiments, wavelengths may be in the UV, DUV, or EUV range. Other embodiments may have different wavelengths. In one embodiment the target wavelength may be 455 nm, so a range of 60 nm-500 nm may be used. For embodiments that are employed to etch copper, power densities in the range of 100 to 10,000 $W/m^2$ may be used. In some embodiments, wavelengths of 365 nm and a mercury arc lamp may be used. In further embodiments, power densities of 1,000,000 $W/m^2$ or more may be used. In some embodiments, to control the power of the LEDs, the input current and/or voltage may be monitored. In other embodiments a separate remote power sensor may be used.

In some embodiments one or more light pipes may be disposed at least partially between the LEDs and the window. The light pipes may be used to direct the light energy from the LEDs to the window. In further embodiments, one or more lenses may be disposed in the light path between the LEDs and the substrate. The lenses may be used to focus the LED light or scatter it. In one embodiment there is no window and the LEDs are located within the chamber. In other embodiments, LEDs of different wavelengths and/or power may be employed in a single substrate processing system. In one embodiment, LEDs having a first wavelength and power may be used for one chemical reaction while LEDs of a second wavelength and power may be used for a separate chemical reaction. In other embodiments, some LEDs may be used to promote a reaction in the plasma region adjacent to the substrate while other LEDs may be used to promote a reaction on the chamber walls, the window, or a different region within the chamber. In further embodiments an LED thermal management system may be configured to control the temperature of the plurality of LEDs. In one embodiment the LEDs may be maintained below 100 C.

Embodiments of the invention include methods of cleaning and/or preventing residue buildup on the window of the substrate processing chamber. In some embodiments a gas injector may be used to flow inert gas across the window. In other embodiments, residue on interior surfaces of the dielectric window may be transformed into a copper halogen layer during a first local plasma. The copper halogen layer may be desorbed as desorbed species from the dielectric window during a second local plasma which occurs after the first local plasma. In some embodiments the window may be maintained at a particular temperature to reduce or prevent residue build up. In one embodiment the temperature of the window may be maintained at approximately 65 C. Myriad other methods may be used to clean and/or prevent residue on the window.

In some embodiments the substrate processing system energizes specific precursors, process gases, and chemistries. By using the monochromatic properties of solid state sources (SSS) (e.g., LEDs, laser diodes, etc.) the chamber may be used to target the dissociation energy of a certain bond to break them in preparation for subsequent processes. In another embodiment, a separate source (plasma, heat, etc.) could dissociate the bond while the monochromatic light from the solid state source (such as LEDs) delivers energy to the dissociated reactants at a wavelength of their peak absorbance.

Processes with advanced chemistries may increase with the need for more precise control on gas phase reactions, byproducts, and surface reactions as the industry moves toward single-digit nanometer-sized features with exotic materials and interfaces. In some embodiments the substrate processing system may be tuned to a specific chemistry by selecting a SSS and using specific wavelengths to "tailor" or induce only the desired reactions for best control in reactors.

A few example reactions and processes are shown below. It is understood that these are examples only and the invention is not limited by these examples:
1. $Cl_2+Cu->CuCl_2$ or CuCl. Then $CuCl_2$ or $CuCl+UV->Cu_3Cl_3$ (a more volatile species of CuCl)
2. $Cu(s)+H_2(g)->CuH(g)$ -or- $Cu(s)+H_2(g)+UV->CuH(g)$. UV imparts more energy to help make more H+ to create CuH.
3. 2 Step Process involving $Cl_2+H_2+UV$:
   a. $Cl_2+Cu->CuCl_2$ or CuCl.
   b. Then surface clean. $CuCl_2+H_2->CuH+Cu_xCl_x$ -and/or- $CuCl+H_2->CuH+Cu_xCl_x$. UV may be added to create more volatile species of $Cu_xCl_x$.
4. $O_2$ plasma+$H_2O_2$ (hydrogen peroxide)+hfac (hexafluoroacetylacetone)/$C_2H_5OH$. In a similar way, Cu has been etched with hfac and $O_2$: Both Cu(I) and Cu(II) species may be etched according to the following reaction options:
   a. Option 1: $2Cu(s)+O->Cu_2O(s)$ Then $Cu_2O+2H(hfac)(g)->Cu(s)+Cu(hfac)2(g)+H_2O(g)$.
   b. Option 2: $Cu(s)+O->CuO(s)$ Then $CuO+2H(hfac)(g)->Cu(hfac)2(g)+H_2O(g)$.
   In some embodiments, the use of UV energy may play a role in volatilizing these compounds into gases quicker and cleaning the surfaces. In further embodiments, $O_2$ may also create a protection layer (passivation layer) that may be helpful.
5. $HCl+C_2H_2$: Research has shown that $H_2$ and Cl etch Cu. In some embodiments both $H_2$ and Cl may be added via HCL. Addition of an organic, $C_2H_2$ may result in higher CuH formation. In further embodiments, carbon may also create a protection layer for the copper which may be beneficial.
   a. An example reaction may be: $Cu(s)+HCl(g)+C_2H_2(g)->CuH+Cu_xCl_x+C_x$ (some form of carbon containing species)
6. Two stage reactions:
   a. Oxidation Reactions
      i. $2Cu(s)+H_2O\ 2(g)=>Cu_2O(s)+H_2O(g)$ and/or
      ii. $Cu(s)+H_2O\ 2(g)=>CuO(s)+H_2O(g)$
   b. Secondary Reactions
      i. $Cu_2O(s)+2hfacH(g)=>Cu(s)+Cu(hfac)2(g)+H_2O(g)$ and/or
      ii. $CuO(s)+2hfacH(g)=>Cu(hfac)z(g)+H_2O(g)$ In other embodiments, the etchant gas may comprise a halide, an oxidizer and/or a hydride. In further embodiments, any of these example reactions could use cobalt in place of copper. In still further embodiments, other metals may be used. In other embodiments, any of these example reactions could also be implemented at low and high temperatures (−50 to 350 C).

Depending on the chemistries involved, illuminating a surface in the presence of gas precursor can enhance the rate of chemical reactions by thermal or other means. For example, the light may excite gas phase molecules, adsorbed molecules, or even excite the substrate to promote a chemical reaction on the surface. The wavelength of the LED may be selected to promote desirable film processes by, for example, choosing a wavelength which is resonant with a molecular electronic transition in order to enhance a reaction rate. The wavelength may also be chosen to enhance absorption of the radiation by the substrate, thereby heating the substrate more efficiently.

In further embodiments, the substrate processing system can be combined with existing plasma based reactors, as well as be incorporated into plasma chambers. In some embodiments the substrate processing system may consist, but shall not be limited by, any combination of the following:
1. An LED source, that can be pulsed or continuous, to dissociate process gases. This source could be monochromatic with wavelengths between 100 nm and 2000 nm or it could consist of multiple wavelengths.
2. A source for controlling the surface temperature of the wafer. This could include a pedestal that heats conductively, a light source (SSS or traditional), or resistive heating. The LED heat source could be used to heat the wafer surface in pulses of energy, or heat continuously.
3. A pulsed or continuous source to energize process gases after they have been dissociated. This source could be monochromatic with wavelengths between 100 nm and 2000 nm or it could consist of multiple wavelengths.
4. A pulsed or continuous plasma source to dissociate process gases with biasing power ranging from 100-2000 W, pulsing frequency of 1-60 MHz, and duty cycle of 10-90%.
5. A pulsed or continuous gas supply system. In some embodiments, individual gasses or a combination of gasses may be pulsed. In further embodiments individual gasses or a combination of gasses may be continuously supplied while in further embodiments some gasses may be continuously supplied while other gasses are pulsed.

In further embodiments, multiple LED sources could be used in the same chamber to perform various functions such as heating wafers, heating chamber walls, dissociation of precursors, excitation of reactants or byproducts, as well as chamber management, or other processes. Therefore, multiple LED and other sources could be placed in various locations in the chamber.

Thus, in some embodiments a substrate processing system combining a plasma source (ICP, CCP, remote, or microwave), a heating source (LED or conventional), and a new SSS capable of finely controlling reactions of the process gases may be used. Such a system may enable much finer control of advanced applications desired for future nodes of technology.

Figure 3:
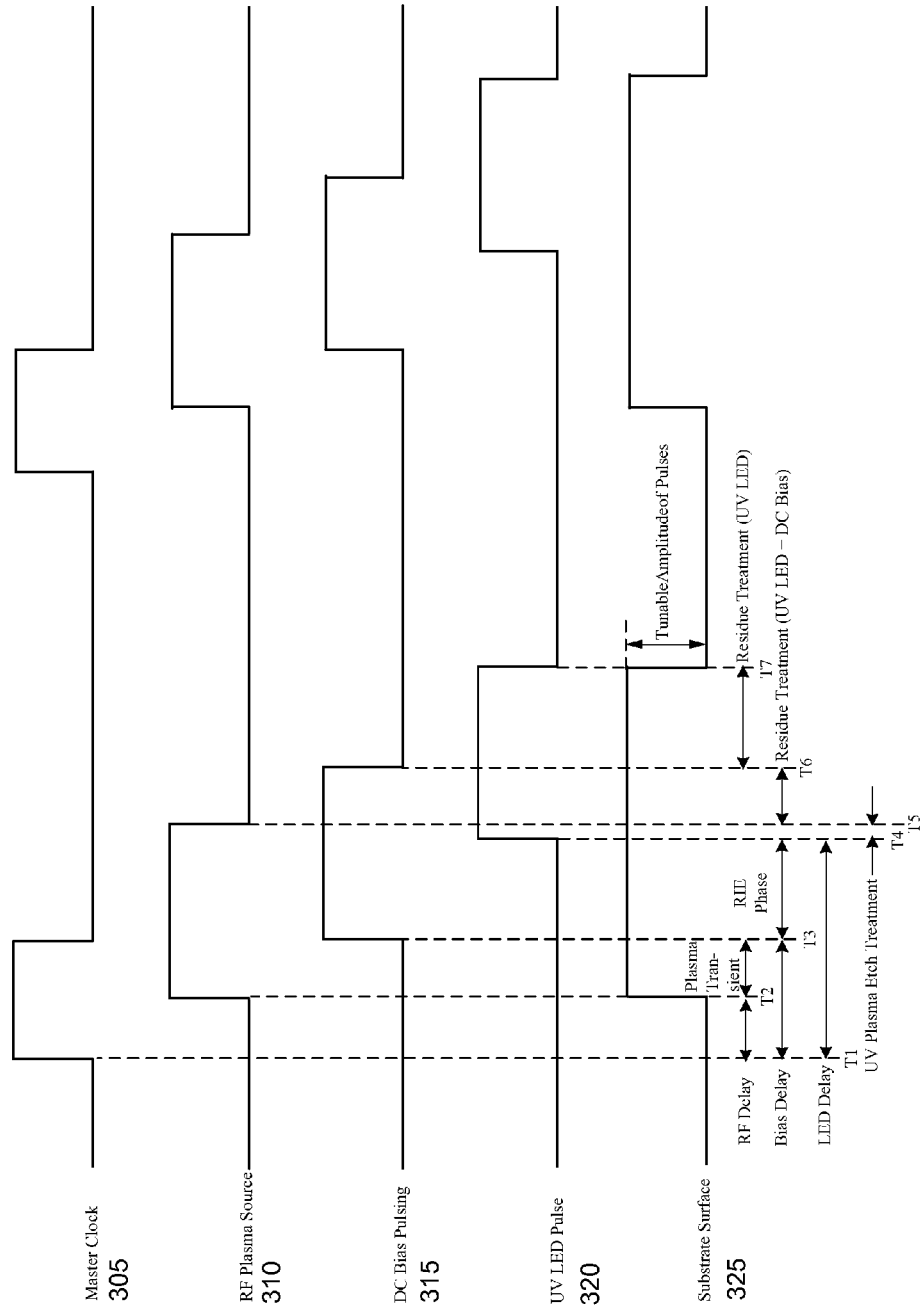
FIG. 3 is an example of a pulsed processing sequence for a substrate processing system according to some embodiments.

FIG. 3 illustrates an example embodiment of a processing system incorporating a pulsed RF plasma source 310, pulsed DC bias 315 and pulsed UV LEDs 320. Other embodiments may have other configurations. Master clock 305 may be used to synchronize the pulsing of the various systems. At time T1 master clock 305 initiates a pulse. At time T2, RF plasma source 310 turns on, activating a plasma within the chamber and etching the substrate surface. At time T3, DC bias 315 turns on, providing a DC bias between the substrate and an electrode. Thus, between time T2 and T3, a plasma transient occurs where the substrate is exposed to the plasma. At time T4 UV LEDs 320 are turned on. Thus, between time T3 and T4 the substrate is exposed to reactive ion etching (RIE) with a DC biased plasma. At time T5 RF plasma 310 shuts off. Thus, between time T4 and T5a UV plasma etch treatment occurs. At time T6, DC bias 315 turns off. Thus, between time T5 and T6 residue treatment employing UV LED's and DC bias occurs. At time T7, UV LED pulse 320 turns off. Thus, between time T6 and T7 residue treatment employing UV LEDs 320 occurs. The amplitude of any of the pulses may be tuned to optimize the process. The overlay, delay and sequence of any of the pulses may be changed to further optimize the process.

Figure 4:
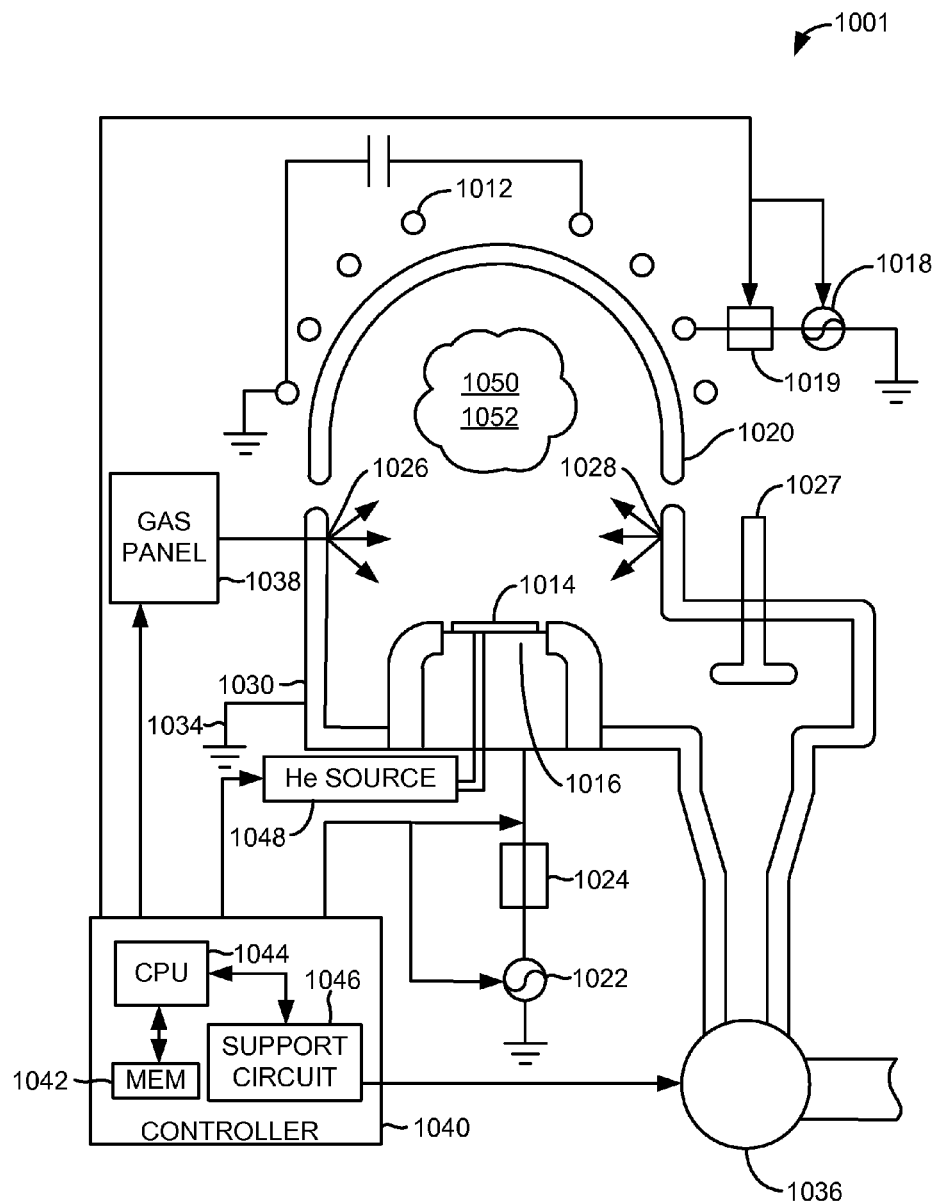
FIG. 4 is a schematic diagram of an etch process chamber which can be used to carry out processes according to some embodiments.

FIG. 4 depicts a schematic diagram of an example etch process chamber 1001 that may be used in an embodiment. Etch process chamber 1001 may be incorporated into a substrate processing system 1101 described later with reference to FIG. 4. Example etch process chamber 1001 may also be referred to as a decoupled-plasma source chamber or DPS chamber. Etch process chamber 1001 includes inductive coils 1012, positioned exterior to a dielectric, dome-shaped ceiling 1020 (referred to herein as the dome 1020). Other chambers may have other types of ceilings, e.g., a flat ceiling. Inductive coil 1012 can be coupled to a radio-frequency (RF) source 1018 (that is generally capable of producing an RF signal having a tunable frequency). RF source 1018 is coupled to inductive coil 1012 through a matching network 1019. Etch process chamber 1001 can include a substrate support pedestal (cathode) 1016 that is coupled to a second RF source 1022 that is generally capable of producing an RF signal. RF source 1022 can be coupled to pedestal 1016 through a matching network 1024. Etch process chamber 1001 may also contain a conductive chamber wall 1030 that is connected to an electrical ground 1034. In other embodiments process chamber 1001 may employ a DC biasing network. Further embodiments of process chamber 1001 may generate a plasma using other variations such as a toroidal source, inductive coils located around walls 1030 or other configurations. A controller 1040 including a central processing unit (CPU) 1044, a memory 1042, and support circuits 1046 for a CPU 1044 is coupled to various components of etch process chamber 1001 to facilitate control of the etch process.

In operation, a semiconductor substrate 1014 is placed on pedestal 1016 and gaseous components are supplied from a gas handling system 1038 to etch process chamber 1001 through entry port(s) 1026 to form a gaseous mixture 1050. Gaseous mixture 1050 is ignited into a plasma 1052 in etch process chamber 1001 by applying RF power from RF sources 1018 and 1022 respectively to inductive coil 1012 and pedestal 1016. The pressure within the interior of etch process chamber 1001 is controlled using a throttle valve 1027 situated between etch process chamber 1001 and a vacuum pump 1036. The temperature at the surface of chamber wall 1030 is controlled using liquid-containing conduits (not shown) that are located in chamber wall 1030 of etch process chamber 1001. The temperature at the surface of dome 1020 may also be controlled using a circulating liquid or other means.

The temperature of substrate 1014 is controlled by stabilizing the temperature of pedestal 1016 and flowing helium gas from a helium source 1048 to channels formed by the back of substrate 1014 and grooves (not shown) on the pedestal surface. The helium gas is used to facilitate heat transfer between pedestal 1016 and substrate 1014. During the etch process, substrate 1014 is heated by a resistive heater within the pedestal to a steady state temperature and the helium facilitates uniform heating of substrate 1014. Using thermal control of both dome 1020 and pedestal 1016, substrate 1014 is maintained at a temperature of between about −200° C. and about 500° C.

Figure 5:
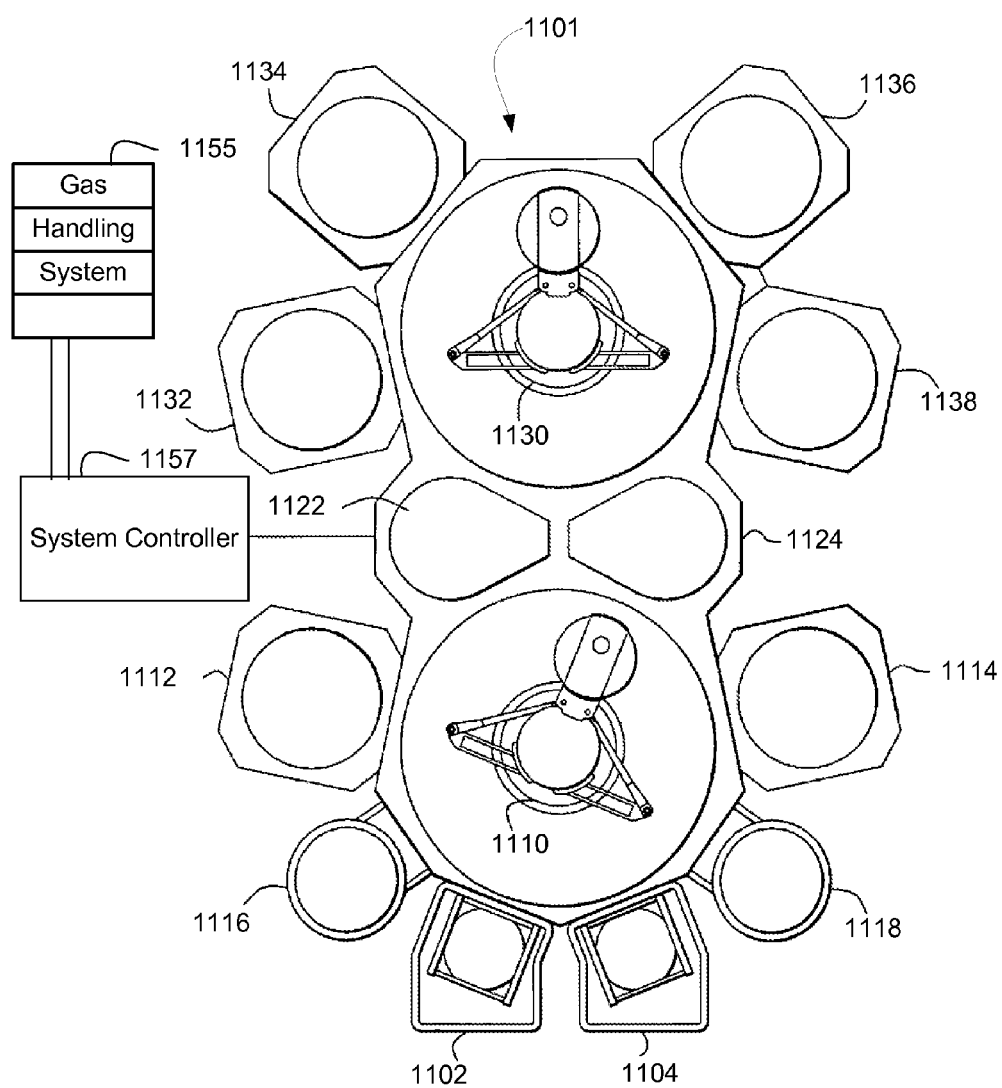
FIG. 5 is a schematic top-view diagram of an exemplary multi-chamber substrate processing system which can be used to carry out processes according to some embodiments.

FIG. 5 is a schematic top-view diagram of an illustrative multi-chamber processing system 1101. The processing system 1101 can include one or more load lock chambers 1102, 1104 for transferring of substrates into and out of the processing system 1101. Typically, since the processing system 1101 is under vacuum, the load lock chambers 1102, 1104 may "pump down" the substrates introduced into the processing system 1101. A first robot 1110 may transfer the substrates between the load lock chambers 1102, 1104, and a first set of one or more substrate processing chambers 1112, 1114, 1116, 1118 (four are shown). Each processing chamber 1112, 1114, 1116, 1118, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The first robot 1110 can also transfer substrates to/from one or more transfer chambers 1122, 1124. The transfer chambers 1122, 1124 can be used to maintain ultrahigh vacuum conditions while allowing substrates to be transferred within the processing system 1101. A second robot 1130 can transfer the substrates between the transfer chambers 1122, 1124 and a second set of one or more processing chambers 1132, 1134, 1136, 1138. Similar to processing chambers 1112, 1114, 1116, 1118, the processing chambers 1132, 1134, 1136, 1138 can be outfitted to perform a variety of substrate processing operations including the UV LED etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 1112, 1114, 1116, 1118, 1132, 1134, 1136, 1138 may be removed from the processing system 1101 if not necessary for a particular process to be performed by the processing system 1101. A copper etch processing chamber for carrying out the methods described herein may be installed in any one or more of substrate processing chamber locations.

System controller 1157 is used to control motors, valves, flow controllers, power supplies and other functions required to carry out process recipes described herein. System controller 1157 may rely on feedback from optical sensors to determine and adjust the position of movable mechanical assemblies. Mechanical assemblies may include the robot, throttle valves and susceptors which are moved by motors under the control of system controller 1157. A gas handling system 1155 is used to deliver halogen-containing precursors and inert species at various stages during the methods described herein.

In an example embodiment, system controller 1157 includes a hard disk drive (memory), USB ports, a floppy disk drive and a processor. System controller 1157 includes analog and digital input/output boards, interface boards and stepper motor controller boards. Various parts of multi-chamber processing system 1101 which contains processing chamber 400 are controlled by system controller 1157. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching a substrate having a layer of a metal formed thereon, the method comprising:
    positioning the substrate in a substrate processing chamber; and
    while the substrate is in the chamber, exposing the layer of copper to a plasma of an etchant gas at a temperature less than 250 degrees centigrade thereby forming one or more metal byproducts, and exposing the one or more copper byproducts to radiation from a solid state source having a wavelength between 10-2000 nm to desorb at least one of the one or more metal byproducts,
    wherein the metal is one of copper or cobalt; and
    wherein the etchant gas includes at least one of a hydride compound, $H_2$, or an oxidizer including an oxygen atom.

2. The method of etching the substrate of claim 1 wherein the solid state source is an LED source.

3. The method of etching the substrate of claim 1 wherein the solid state source is a laser diode.

4. The method of etching the substrate of claim 1, wherein the exposure of the one or more metal byproducts to radiation occurs while the substrate is exposed to the plasma of the etchant gas.

5. The method of etching the substrate of claim 1 wherein the exposure to the plasma and the exposure to the radiation are continuously pulsed.

6. The method of etching the substrate of claim 1 wherein the wavelength is between 60-500 nm.

7. The method of etching the substrate of claim 1 wherein the temperature is less than 150 degrees C.

8. The method of etching the substrate of claim 1, wherein the metal byproducts comprise the metal and a halogen.

9. The method of etching the substrate of claim 1, wherein a subsequent etchant gas comprising a hydride compound or $H_2$ is used.

10. The method of etching the substrate of claim 9, wherein the metal byproducts comprise the metal and hydrogen.

11. The method of etching the substrate of claim 1 wherein the etchant gas comprises a halide compound and a hydride compound.

12. The method of etching the substrate of claim 1 wherein the etchant gas comprises $Cl_2$ and $H_2$.

13. The method of etching the substrate of claim 1 wherein the oxidizer comprises $O_2$.

14. The method of etching the substrate of claim 1 wherein a subsequent etchant gas comprising $H_2O_2$ is used.

15. The method of etching the substrate of claim 1 wherein the etchant gas comprises hexafluoroacetylacetone (hfac).

16. The method of etching the substrate of claim 1 wherein the etchant gas comprises $H_2O_2$ and hfac.

17. The method of etching the substrate of claim 1 wherein the etchant gas comprises $O_2$ and hfac.

18. The method of etching the substrate of claim 1 wherein the etchant gas comprises HCl.

19. The method of etching the substrate of claim 18 wherein the etchant gas further comprises $C_2H_2$.

* * * * *